United States Patent
Kister

(10) Patent No.: US 9,250,266 B2
(45) Date of Patent: Feb. 2, 2016

(54) PROBE BONDING METHOD HAVING IMPROVED CONTROL OF BONDING MATERIAL

(75) Inventor: January Kister, Portola Valley, CA (US)

(73) Assignee: MICROPROBE, INC., Carlsbad, CA (US)

( * ) Notice: Subject to any disclaimer, the term of this patent is extended or adjusted under 35 U.S.C. 154(b) by 861 days.

(21) Appl. No.: 13/557,879

(22) Filed: Jul. 25, 2012

(65) Prior Publication Data

US 2012/0313621 A1      Dec. 13, 2012

Related U.S. Application Data

(62) Division of application No. 12/156,131, filed on May 29, 2008, now Pat. No. 8,230,593.

(51) Int. Cl.
*G01R 31/20* (2006.01)
*G01R 3/00* (2006.01)

(52) U.S. Cl.
CPC .............. *G01R 3/00* (2013.01); *Y10T 29/4922* (2015.01); *Y10T 29/49158* (2015.01); *Y10T 29/49163* (2015.01); *Y10T 29/49208* (2015.01); *Y10T 29/49213* (2015.01); *Y10T 29/49222* (2015.01)

(58) Field of Classification Search
CPC ........... G01R 1/07314; G01R 1/06755; G01R 1/073; G01R 1/07371; G01R 3/00; Y10T 29/49117; Y10T 29/49158; Y10T 29/49208; Y10T 29/49222; H01R 43/20; Y10S 439/912
USPC ............... 324/754.01, 754.07, 754.03, 754.1, 324/754.11, 755.01, 755.11, 713, 715, 724, 324/72.5, 149, 750.25, 756.03; 29/846, 29/848, 851, 855, 876, 877, 883, 884; 264/263, 276; 438/66, 67, 91, 591
See application file for complete search history.

(56) References Cited

U.S. PATENT DOCUMENTS

| | | | |
|---|---|---|---|
| 2,754,203 | A | 7/1956 | Vordahl |
| 4,314,855 | A | 2/1982 | Chang et al. |
| 4,871,964 | A | 10/1989 | Boll et al. |
| 4,973,903 | A | 11/1990 | Schemmel |

(Continued)

FOREIGN PATENT DOCUMENTS

| JP | 63307678 | 12/1988 |
|---|---|---|
| JP | 10311864 | 11/1998 |

(Continued)

*Primary Examiner* — Patrick Assouad
*Assistant Examiner* — Sean Curtis
(74) *Attorney, Agent, or Firm* — Peacock Myers, P.C.; Deborah A. Peacock; Philip D. Askenazy

(57) ABSTRACT

In assembly of probe arrays for electrical test, a problem can arise where a bonding agent undesirably wicks between probes. According to embodiments of the invention, this wicking problem is alleviated by disposing an anti-wicking agent on a surface of the probe assembly such that wicking of the bonding agent along the probes toward the probe tips is hindered. The anti-wicking agent can be a solid powder, a liquid, or a gel. Once probe assembly fabrication is complete, the anti-wicking agent is removed. In preferred embodiments, a template plate is employed to hold the probe tips in proper position during fabrication. In this manner, undesirable bending of probes caused by introduction or removal of the anti-wicking agent can be reduced or eliminated.

24 Claims, 3 Drawing Sheets

(56) References Cited

U.S. PATENT DOCUMENTS

| | | | |
|---|---|---|---|
| 5,468,994 A | 11/1995 | Pendse | |
| 5,642,056 A | 6/1997 | Nakajima et al. | |
| 5,834,946 A | 11/1998 | Albrow et al. | |
| 5,952,843 A * | 9/1999 | Vinh | G01R 1/07357 324/72.5 |
| 6,024,584 A * | 2/2000 | Lemke | H01R 43/0256 439/83 |
| 6,292,003 B1 * | 9/2001 | Fredrickson | G01R 1/0483 324/750.25 |
| 6,359,452 B1 | 3/2002 | Mozzetta | |
| 6,414,502 B1 | 7/2002 | Sayre et al. | |
| 6,538,336 B1 | 3/2003 | Secker et al. | |
| 6,768,331 B2 | 7/2004 | Longson et al. | |
| 6,891,385 B2 | 5/2005 | Miller | |
| 6,917,525 B2 * | 7/2005 | Mok | G01R 1/06716 361/767 |
| 7,061,257 B2 | 6/2006 | Khandros et al. | |
| 7,068,057 B2 | 6/2006 | Tervo et al. | |
| 7,126,361 B1 | 10/2006 | Anderson et al. | |
| 7,218,127 B2 * | 5/2007 | Cooper | G01R 31/2887 324/750.16 |
| 7,667,471 B2 | 2/2010 | Kurotori et al. | |
| 7,733,101 B2 | 6/2010 | Kister | |
| 7,733,103 B2 | 6/2010 | Park et al. | |
| RE43,503 E | 7/2012 | Kister | |
| 8,230,593 B2 * | 7/2012 | Kister | G01R 3/00 29/848 |
| 8,299,394 B2 | 10/2012 | Theppakuttai et al. | |
| 8,310,253 B1 | 11/2012 | Mardi et al. | |
| 8,415,963 B2 * | 4/2013 | Kister | G01R 1/06733 324/754.03 |
| RE44,407 E * | 8/2013 | Kister | G01R 1/07378 324/754.03 |
| 8,723,546 B2 * | 5/2014 | Kister | G01R 1/07314 324/754.03 |
| 8,988,091 B2 * | 3/2015 | Kister | G01R 1/06716 324/755.01 |
| 9,097,740 B2 * | 8/2015 | Kister | G01R 1/06761 1/1 |
| 2002/0177782 A1 | 11/2002 | Penner | |
| 2003/0218244 A1 | 11/2003 | Lahiri et al. | |
| 2003/0218865 A1 | 11/2003 | Macias | |
| 2006/0186905 A1 | 8/2006 | Kohashi et al. | |
| 2006/0189867 A1 | 8/2006 | Revie et al. | |
| 2006/0208752 A1 | 9/2006 | Tanioka et al. | |
| 2006/0261828 A1 | 11/2006 | Cram et al. | |
| 2007/0229103 A1 | 10/2007 | Tani | |
| 2008/0001613 A1 | 1/2008 | Kister | |
| 2008/0088331 A1 | 4/2008 | Yoshida | |
| 2008/0258746 A1 | 10/2008 | Tran et al. | |
| 2009/0079455 A1 | 3/2009 | Gritters | |
| 2009/0293274 A1 * | 12/2009 | Kister | G01R 3/00 29/879 |
| 2011/0006796 A1 * | 1/2011 | Kister | G01R 1/07314 324/756.01 |
| 2012/0242363 A1 | 9/2012 | Breinlinger et al. | |
| 2012/0286816 A1 | 11/2012 | Kister | |
| 2012/0313660 A1 | 12/2012 | Kister | |
| 2013/0082729 A1 | 4/2013 | Fan et al. | |
| 2013/0093450 A1 | 4/2013 | Kister | |
| 2013/0150696 A1 * | 6/2013 | Han | A61B 5/0478 600/378 |

FOREIGN PATENT DOCUMENTS

| | | |
|---|---|---|
| TW | 201109669 | 3/2011 |
| WO | 0054066 | 9/2000 |

\* cited by examiner

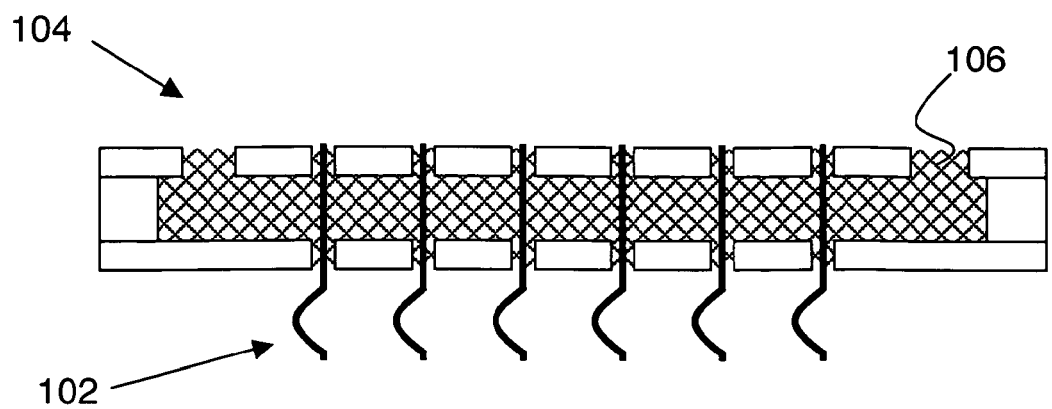
Fig. 1a
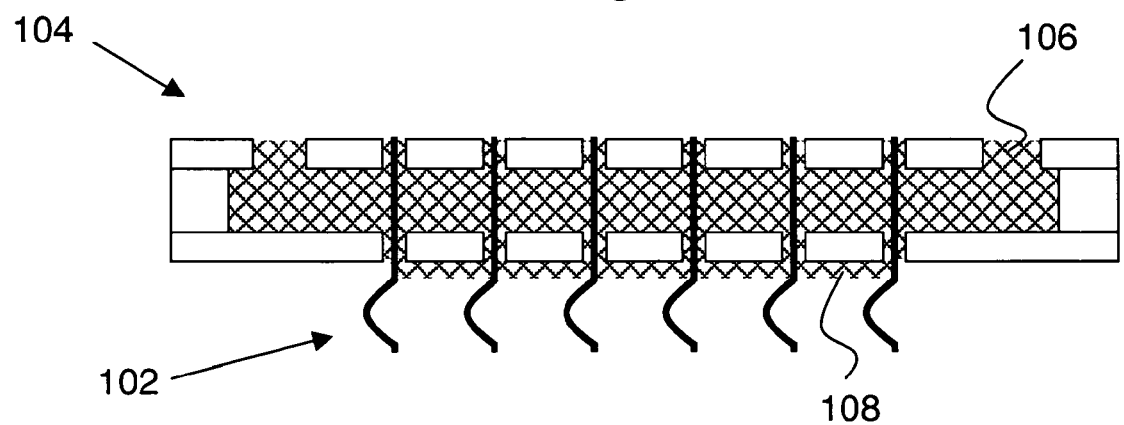
Fig. 1b
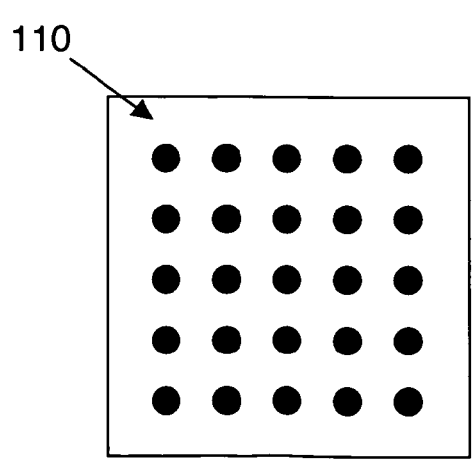 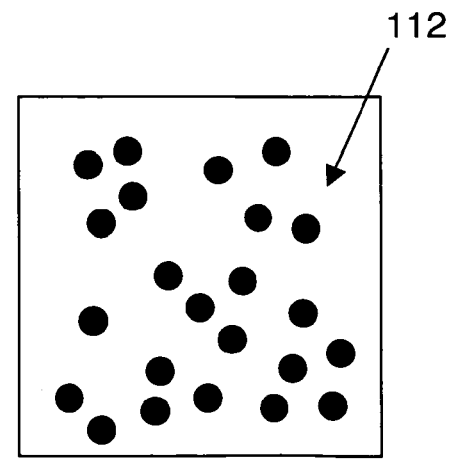
Fig. 1c             Fig. 1d

PROBE BONDING METHOD HAVING IMPROVED CONTROL OF BONDING MATERIAL

CROSS-REFERENCE TO RELATED APPLICATIONS

This application is a divisional application of U.S. patent application Ser. No. 12/156,131 (now U.S. Pat. No. 8,230,593), entitled, "Probe Bonding Material Having Improved Control of Bonding Material", to January Kister, filed on May 29, 2008 and the specification and claims thereof are incorporated herein by reference.

FIELD OF THE INVENTION

This invention relates to probe assemblies for making temporary electrical contact to devices or circuits under test.

BACKGROUND ART

Probes and probe arrangements for making temporary electrical contact to devices or circuits under test have been in widespread use for many years. Accordingly, many aspects of this technology have been developed. Although much of this technological development has focused on details pertaining to the probes, other aspects of probe technology have also been considered, More specifically, probes are typically attached to a probe card, or some other form of substrate, and some work has focused on improvements relating to the probe card/substrate.

For example, in U.S. Pat. No. 6,881,974, a probe card manufacturing approach which starts by forming blind holes in a substrate and filling these holes with an electrically conductive metal is considered. After subsequent processing, part of the metal in the blind holes is exposed to form the probe pins. In U.S. Pat. No. 6,259,261, a probe assembly is considered where a selector card can be employed to determine the pin pattern of the probing card. In U.S. Pat. No. 6,566,898, a multi-layer probe card substrate having an improved thermal expansion match to silicon is considered. In U.S. Pat. No. 6,586,955, a probe assembly having cavities filled with a low melting point metal, which are individually electrically connected to probe tips, is considered. By including a molten or near-molten metal section in each probe, metal fatigue in the probes can be alleviated, and cracking can be avoided or rendered less harmful by self-healing.

However, as integrated circuit technology continues to develop, it is necessary to probe at increasingly fine probe pitch (i.e., reduced probe spacing). This evolution can generate problems that have not apparently arisen in connection with electrical probing before, and which require new solutions.

SUMMARY

One such problem is shown in the example of FIGS. 1a-d. FIG. 1a shows a probe assembly 104 having probes 102 fixed in position by a bonding material 106 (e.g., epoxy). This kind of probe bonding approach has been considered in U.S. Pat. No. 7,345,492, issued to the present inventor, and incorporated herein by reference in its entirety. It has been found that a wicking problem can arise in connection with this probe bonding approach, as shown on FIG. 1b. Throughout this application, "wicking" refers to situations where bonding material ends up being disposed between probes at locations (e.g., 108 on FIG. 1b) outside the main bonding cavity of the probe assembly. This wicking is highly undesirable because it typically interferes with proper probe motion during operation.

In investigations to date, wicking has most commonly been observed in irregular probe arrays (e.g., probe array 112 on FIG. 1d), where closely spaced probes that are well-separated from other probes in the array tend to experience wicking. In general, probes having relatively large pitch (e.g., lateral spacing 175 µm or more) tend not to exhibit wicking, while regular probe arrays (e.g., probe array 110 on FIG. 1c) tend to be relatively well-behaved with respect to wicking (e.g., no wicking seen on a regular probe array having 110 µm probe pitch). However, it is expected that wicking in regular probe arrays is likely to be a problem for pitches of 100 µm or less. It is presently believed that wicking of the epoxies presently used for probe bonding occurs mainly during curing of the epoxy, because the elevated temperature for curing causes a temporary reduction in epoxy viscosity. This reduced viscosity enables the epoxy to more freely flow along the probes, thereby exacerbating the wicking problem.

According to embodiments of the invention, this wicking problem is alleviated by disposing an anti-wicking agent on a surface of the probe assembly such that wicking of the bonding agent along the probes toward the probe tips is hindered. The anti-wicking agent can be a solid powder, a liquid, or a gel. Once probe assembly fabrication is complete, the anti-wicking agent is removed. In preferred embodiments, a template plate is employed to hold the probe tips in proper position during fabrication. In this manner, undesirable bending of probes caused by introduction or removal of the anti-wicking agent can be reduced or eliminated.

BRIEF DESCRIPTION OF THE DRAWINGS

FIGS. 1a-b show a problem that can arise in connection with probe assemblies having closely spaced probes.

FIGS. 1c-d show examples of probe arrangements.

DETAILED DESCRIPTION

Figure 2A:
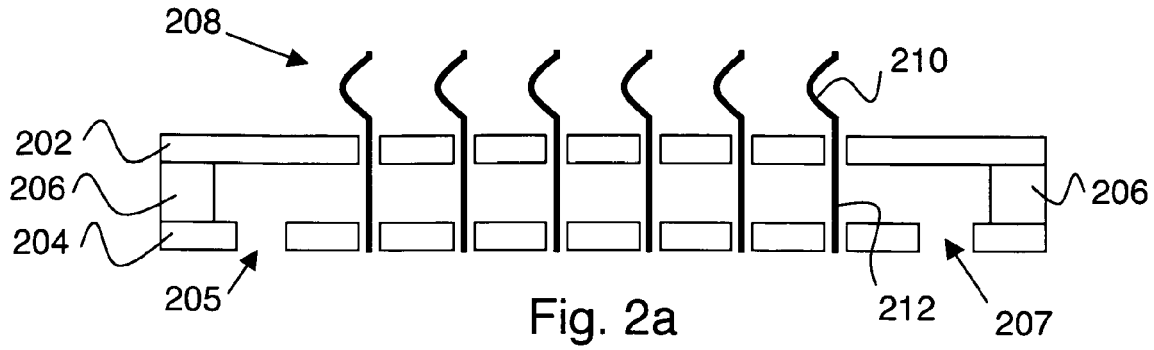
FIGS. 2a-d show steps of a probe assembly fabrication sequence according to an embodiment of the invention.

FIGS. 2a-d show steps of a probe assembly fabrication sequence according to an embodiment of the invention. On FIG. 2a, a first guide plate 202 is separated from a second guide plate 204 by a spacer 206. Guide plates 202 and 204, in combination with spacer 206, form a guide plate assembly and define a bonding cavity (i.e., the region between plates 202 and 204 and surrounded by spacer 206). Guide plates 202 and 204 include holes within which probes are disposed.

More specifically, each of probes 208 has a base section and a tip section. The base and tip sections of one of the probes are shown on FIGS. 2a as 212 and 210 respectively. The base sections of the probes are disposed in the guide plate holes such that the base sections of the probes pass through the bonding cavity of the guide plate assembly. By way of example, gaps between the probes and the guide plates at the holes are typically between 5 µm and 40 µm. and lateral probe spacing is typically less than about 150 µm.

Typically, the first and second guide plates have corresponding first and second hole patterns that are aligned with each other, so that substantially straight probe base sections fit into the guide plate assembly, as shown. In most cases, all of the probe tip sections face the same way relative to the guide plate assembly, also as shown.

Figure 2B:
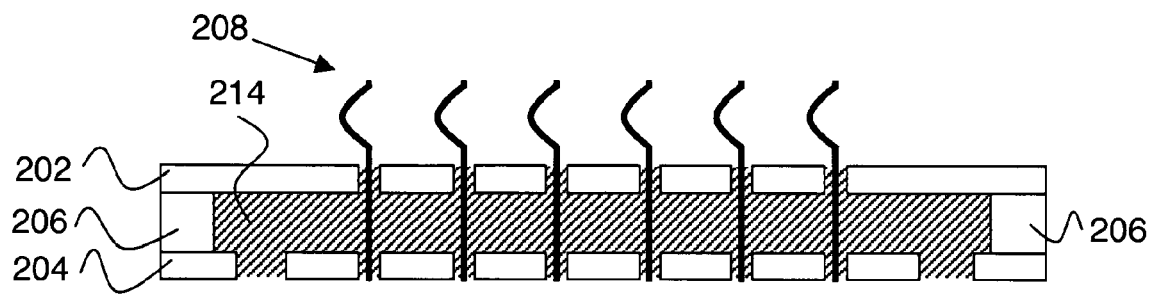

FIG. 2b shows the result of filling the bonding cavity with a curable bonding agent 214. Such filling can be performed by introducing the bonding agent through guide plate holes such as 205 and 207 on FIG. 2a. Suitable bonding agents include, but are not limited to: epoxies, thermally set materials, molten plastics and injection molding materials.

Figure 2C:
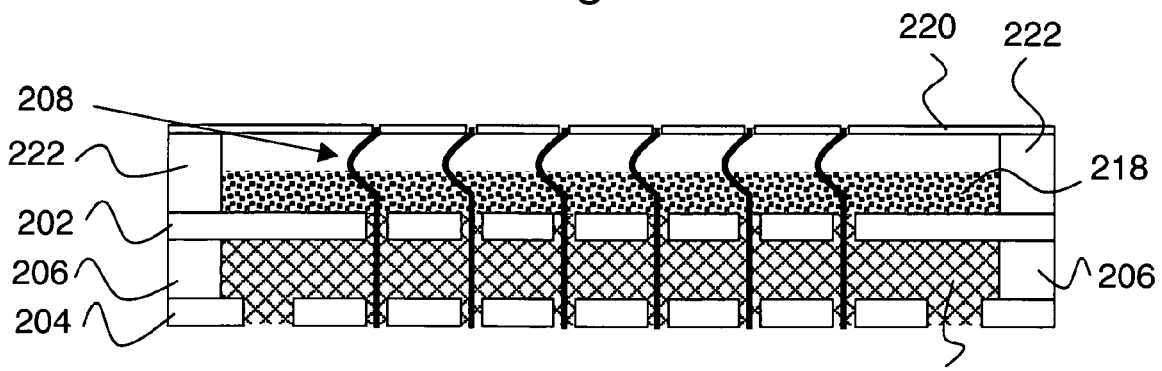

FIG. 2c shows the result of the following steps:
a) (optional) providing a probe tip template 220 (supported by a frame 222) and engaging tip sections of probes 208 with the probe tip template (e.g., as shown on FIG. 2c) before adding the anti-wicking agent;
b) disposing an anti-wicking agent 218 on a surface of the guide plate assembly facing the tip sections of the probes; and
c) curing the bonding agent after disposing the anti-wicking agent. The cured bonding agent is referenced as 216.

Typically, curing is performed by heating the probe assembly, although other curing processes can also be employed in practicing the invention. The bonding agent and curing process are preferably selected such that the bonding agent viscosity is lower during part of the curing step than before curing is initiated. This combination of properties facilitates elimination of bonding agent wicking according to embodiments of the invention, because wicking is suppressed at points in the process where it would otherwise be most likely to occur (i.e., during curing). Suitable materials for the optional probe tip template include polyimide, ceramics and metals.

Figure 2D:
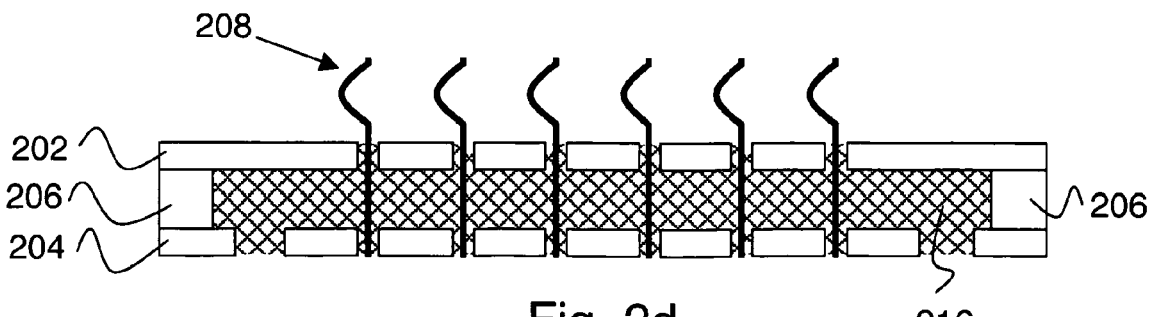

FIG. 2d shows the result of removing anti-wicking agent 218 after the bonding agent is cured (and of removing the probe tip template in cases where a probe tip template is employed). Anti-wicking agent 218 can be removed by vacuuming, and ultrasonic cleaning can be employed as a final cleaning step.

In the example of FIGS. 2a-d, anti-wicking agent 218 is a solid powder. It is important that bonding agent 214 not wick into the solid particles of anti-wicking agent 218. Various methods can be employed, individually or in combination, to reduce/prevent such wicking. For example, the particles of anti-wicking agent 218 can be compacted during deposition. Another method is to select solid powder materials having surfaces that are not wetted by the bonding agent. For example, talc and starch flour have been found to be suitable anti-wicking agents for an epoxy bonding agent. Fine powders are typically employed for the anti-wicking agent (e.g., particle size about 3 μm). A powder anti-wicking agent having about 0.3 μm particles has been found to be effective for blocking epoxy wicking through probe to guide plate gaps of about 20 μm. A syringe capable of delivering the solid particles (i.e., having a needle bore substantially larger than the particle size) has been found suitable for delivering and compacting the anti-wicking agent. A commercial programmable epoxy dispenser can be adapted to control the amount of applied anti-wicking powder.

Figure 3:
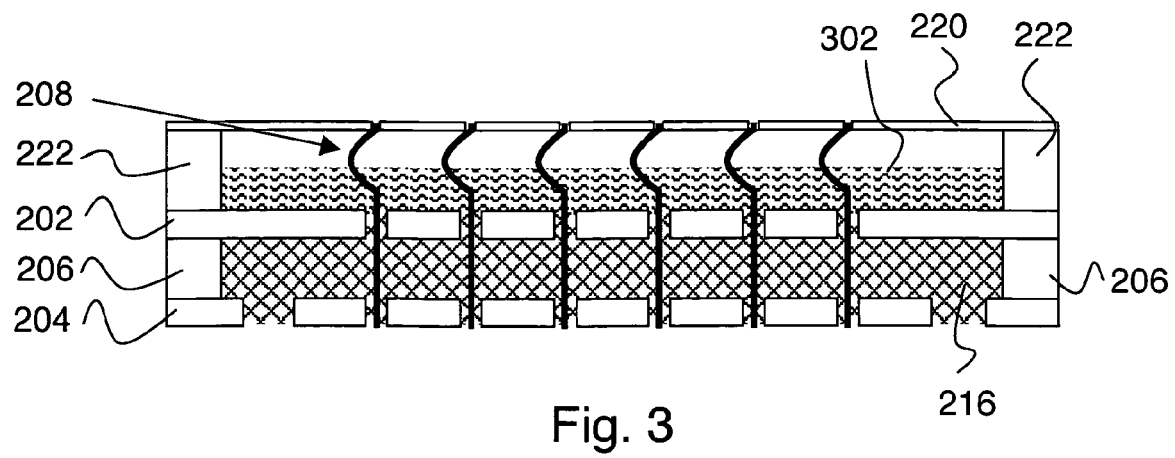
FIG. 3 shows an approach for prevention of inter-probe wicking according to an alternate embodiment of the invention.

FIG. 3 shows a fabrication step relating to an alternate embodiment of the invention. FIG. 3 corresponds to FIG. 2c, except that a gel or liquid anti-wicking agent 302 is used on FIG. 3 instead of the solid powder anti-wicking agent of FIG. 2c. In order for a gel or liquid to function properly as an anti-wicking agent, it is preferred that the anti-wicking agent and the bonding agent be immiscible. Suitable gel or liquid anti-wicking agents for practicing embodiments of the invention include silicone based gels and lithography compatible masking fluids. After the bonding agent is cured, the anti-wicking agent can be removed by standard lithographic processes, and accordingly it is preferred for gel or liquid anti-wicking agents to be removable in this manner. In situations where probe assembly fabrication is performed in a clean room environment, it is preferred for the anti-wicking agent to be a gel or a liquid, as opposed to a powder.

Figures 4A, 4B:
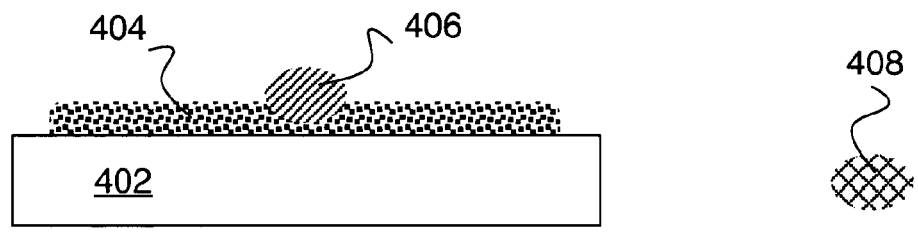
FIGS. 4a-b show steps in a process for evaluating the suitability of anti-wicking materials for practicing embodiments of the invention.

FIGS. 4a-b show steps in a process for evaluating the suitability of anti-wicking materials for practicing embodiments of the invention. In this method, a drop of uncured bonding agent 406 is disposed on a bed of a candidate material 404 on a substrate 402. The bonding agent is cured and then separated from the bed to provide a bead 408. If the surface of bead 408 is smooth and has substantially the same shape as the surface of uncured bonding agent 406 on FIG. 4a, then the bonding agent does not significantly wick into candidate material 404 as it cures, and so candidate material 404 may be a suitable anti-wicking agent. If the surface of bead 408 is rough and/or if the shape of bead 408 is substantially different than the shape of bonding agent 406 on FIG. 4a, then candidate material 404 (as prepared in this test) is not suitable for practicing embodiments of the invention. This test can be employed to evaluate the suitability of powder, liquid and gel candidate materials for practicing embodiments of the invention. It can also be used to evaluate deposition conditions, such as degree of compaction for a powdered candidate material.

Figure 5:
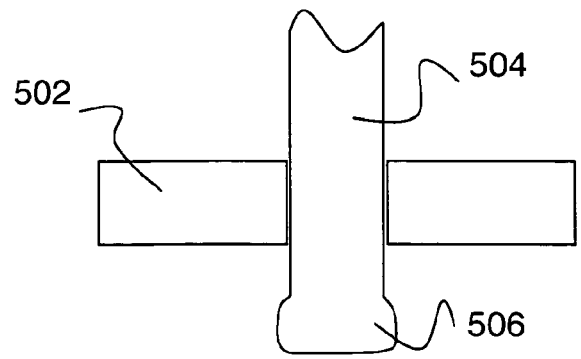
FIG. 5 shows a probe tip template arrangement suitable for use with a preferred embodiment of the invention.

FIG. 5 shows a probe tip template arrangement suitable for use with a preferred embodiment of the invention. More specifically, this figure shows a close-up view of a probe tip section 504 passing through a probe tip template 502 and having a tip 506. Preferably, tip section 504 is narrower than tip 506, as shown. The probe can move vertically with respect to the probe tip template, where tip 506 acts as a limit to keep the probe tip template from sliding off during processing. Preferably, all of the probes in the probe array have this feature which prevents the probe tip template from inadvertently sliding off the probes.

One approach for providing such a probe tip template is as follows. A probe template can be made from a polyimide sheet (e.g., 25 μm thick) with rectangular or square holes formed by laser drilling. The hole size is chosen to be slightly larger than the cross section of probe tip section 504 and slightly smaller than the cross section of probe tip 506, so the probe tip can "click" into the hole with application of a slight insertion force. After assembly and curing of the bonding agent, the template can be removed mechanically by gently pulling it off the probe tips, or chemically or via plasma etch. When mechanical removal is employed, the probe tips sometime mechanically "give" and lose alignment, so the plasma etch removal method is preferred. Plasma etching completely dissolves the polyimide template without changing probe tip alignment.

What is claimed is:
1. A probe assembly comprising:
a bonding cavity;
a plurality of probes disposed in said bonding cavity;
a bonding agent disposed in and cured in said bonding cavity; and
an anti-wicking agent disposed on a surface of said bonding cavity prior to curing.
2. The probe assembly of claim 1 comprising said anti-wicking agent removed from said bonding cavity after said bonding agent has cured.

3. The probe assembly of claim 1 further comprising a guide plate assembly having a first guide plate separated from a second guide plate by a spacer, said guide plate assembly defining said bonding cavity.

4. The probe assembly of claim 3 wherein said guide plate assembly comprises holes in said first and second guide plates.

5. The probe assembly of claim 4 wherein said plurality of probes are disposed in said holes.

6. The probe assembly of claim 5 comprising gaps of about 5 μm to about 40 μm between said plurality of probes and said guide plates.

7. The probe assembly of claim 5 comprising a lateral probe spacing that is less than about 150 μm.

8. The probe assembly of claim 4 wherein said first guide plate comprises a corresponding first hole pattern, said second guide plate comprises a corresponding second hole pattern and said first hole pattern is aligned with second hole pattern.

9. The probe assembly of claim 4 wherein said probes comprise probe tip sections that face the same way relative to said guide plate assembly.

10. The probe assembly of claim 1 wherein said bonding agent comprises a material selected from the group consisting of epoxy, thermally set material, molten plastic, and injection molding material.

11. The probe assembly of claim 1 further comprising:
a probe tip template; and
a tip section of said probes, said tip section engaged with said probe tip template prior to disposing said anti-wicking agent.

12. The probe assembly of claim 11 wherein said probe tip template comprises a material selected from the group consisting of polyimide, ceramic, and metal.

13. The probe assembly of claim 1 wherein said anti-wicking agent comprises a powder.

14. The probe assembly of claim 13 wherein said bonding agent does not substantially wick into said solid powder.

15. The probe assembly of claim 13 wherein said anti-wicking agent comprises a fine powder having a particle size of about 3 μm.

16. The probe assembly of claim 1 wherein said anti-wicking agent comprises talc.

17. The probe assembly of claim 1 wherein said anti-wicking agent comprises starch flour.

18. The probe assembly of claim 1 wherein said anti-wicking agent is compacted.

19. The probe assembly of claim 1 wherein said anti-wicking agent comprises a gel.

20. The probe assembly of claim 19 wherein said gel comprises a silicone based gel.

21. The probe assembly of claim 19 wherein said gel and said bonding agent are substantially.

22. The probe assembly of claim 1 wherein said anti-wicking agent comprises a liquid.

23. The probe assembly of claim 22 wherein said liquid comprises a compatible masking fluid.

24. The probe assembly of claim 22 wherein said liquid and said bonding agent are substantially.

* * * * *